United States Patent
Sun

(10) Patent No.: US 11,769,794 B2
(45) Date of Patent: Sep. 26, 2023

(54) MANUFACTURING METHOD OF HIGH-VOLTAGE SEMICONDUCTOR DEVICE WITH INCREASED BREAKDOWN VOLTAGE

(71) Applicant: Yangtze Memory Technologies Co., Ltd., Wuhan (CN)

(72) Inventor: Chao Sun, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 29 days.

(21) Appl. No.: 17/483,760

(22) Filed: Sep. 23, 2021

(65) Prior Publication Data

US 2022/0013631 A1   Jan. 13, 2022

Related U.S. Application Data

(60) Division of application No. 16/540,067, filed on Aug. 14, 2019, now Pat. No. 11,393,899, which is a continuation of application No. PCT/CN2019/076414, filed on Feb. 28, 2019.

(51) Int. Cl.
 *H01L 29/06*    (2006.01)
 *H01L 29/66*    (2006.01)
 *H01L 29/78*    (2006.01)
 *H01L 21/762*   (2006.01)

(52) U.S. Cl.
 CPC ...... *H01L 29/0653* (2013.01); *H01L 29/0611* (2013.01); *H01L 29/66681* (2013.01); *H01L 29/7816* (2013.01); *H01L 21/762* (2013.01)

(58) Field of Classification Search
 CPC ............. H01L 29/0653; H01L 29/0611; H01L 29/66681; H01L 29/7816; H01L 21/762
 USPC ....................................................... 257/288
 See application file for complete search history.

(56) References Cited

U.S. PATENT DOCUMENTS

| | | |
|---|---|---|
| 5,341,011 A | 8/1994 | Hshieh |
| 5,675,176 A | 10/1997 | Ushiku |
| 5,684,319 A | 11/1997 | Hebert |
| 5,801,423 A | 9/1998 | Manning |
| 5,877,528 A | 3/1999 | So |

(Continued)

FOREIGN PATENT DOCUMENTS

| | | |
|---|---|---|
| CN | 1881613 A | 12/2006 |
| CN | 101150146 A | 3/2008 |

(Continued)

OTHER PUBLICATIONS

Sun, the specification, including the claims, and drawings in the U.S. Appl. No. 16/540,069, filed Aug. 14, 2019.

(Continued)

*Primary Examiner* — Ori Nadav
(74) *Attorney, Agent, or Firm* — Winston Hsu

(57) ABSTRACT

The present disclosure provides a method for manufacturing a high voltage semiconductor device which includes providing a semiconductor substrate; forming at least one first isolation structure and at least one second isolation structure in the semiconductor substrate; forming a gate structure on the semiconductor substrate and at a side of the at least one first isolation structure; and forming at least one first drift region in the semiconductor substrate at a side of the gate structure, in which a bottom of the at least one first isolation structure and a bottom of the at least one second isolation structure are deeper than a bottom of the first drift region.

12 Claims, 14 Drawing Sheets

(56) References Cited

U.S. PATENT DOCUMENTS

| | | |
|---|---|---|
| 6,130,458 A | 10/2000 | Takagi |
| 6,150,697 A | 11/2000 | Teshigahara |
| 6,429,490 B2 | 8/2002 | Sawahata |
| 6,445,038 B1 | 9/2002 | Tihanyi |
| 6,876,035 B2 | 4/2005 | Abadeer |
| 7,667,268 B2 | 2/2010 | Disney |
| 7,893,517 B2 | 2/2011 | Koyama |
| 8,410,553 B2 | 4/2013 | Koo |
| 8,502,344 B2 | 8/2013 | Lu |
| 8,921,972 B2 | 12/2014 | Hsu |
| 10,720,425 B2 | 7/2020 | Anderson |
| 2006/0255406 A1 | 11/2006 | Ichijo |
| 2006/0278924 A1 | 12/2006 | Kao |
| 2007/0045675 A1 | 3/2007 | Chen |
| 2008/0067615 A1 | 3/2008 | Kim |
| 2008/0179672 A1 | 7/2008 | Hirler |
| 2008/0308868 A1 | 12/2008 | Wu |
| 2009/0014815 A1 | 1/2009 | Oh |
| 2009/0218621 A1 | 9/2009 | Pfirsch |
| 2009/0242930 A1 | 10/2009 | Lu |
| 2010/0096697 A1 | 4/2010 | Su |
| 2010/0213517 A1 | 8/2010 | Sonsky |
| 2011/0115016 A1 | 5/2011 | Cha |
| 2011/0233668 A1 | 9/2011 | Obatake |
| 2012/0132956 A1 | 5/2012 | Pfirsch |
| 2012/0223384 A1 | 9/2012 | Huang |
| 2012/0267716 A1 | 10/2012 | Kao |
| 2013/0168730 A1 | 7/2013 | Ashida |
| 2013/0249602 A1 | 9/2013 | Mauder |
| 2014/0339650 A1 | 11/2014 | Smith |
| 2014/0361366 A1 | 12/2014 | Cai |
| 2015/0325693 A1 | 11/2015 | Mori |
| 2016/0276477 A1 | 9/2016 | Wada |
| 2016/0284801 A1 | 9/2016 | Mori |
| 2017/0179266 A1 | 6/2017 | Tanaka |
| 2018/0061713 A1 | 3/2018 | Wang |
| 2018/0212053 A1 | 7/2018 | Fang |
| 2018/0261617 A1 | 9/2018 | Torii |
| 2019/0172946 A1 | 6/2019 | Wu |
| 2020/0279914 A1 | 9/2020 | Sun |

FOREIGN PATENT DOCUMENTS

| | | |
|---|---|---|
| CN | 101345258 A | 1/2009 |
| CN | 101728392 A | 6/2010 |
| CN | 101828253 A | 9/2010 |
| CN | 102097473 A | 6/2011 |
| CN | 103187440 A | 7/2013 |
| CN | 104241354 A | 12/2014 |
| CN | 104617139 A | 5/2015 |
| CN | 105845727 A | 8/2016 |
| CN | 107425046 A | 12/2017 |
| CN | 108630745 A | 10/2018 |
| CN | 109560119 A | 4/2019 |
| EP | 1162664 A1 | 12/2001 |
| EP | 1 868 239 A1 | 12/2007 |
| JP | 2008-78654 A | 4/2008 |
| JP | 2009-260208 A | 11/2009 |
| JP | 2014-107302 A | 6/2014 |
| JP | 2015-95531 A | 5/2015 |
| JP | 2015-216218 A | 12/2015 |
| TW | 201244086 A1 | 11/2012 |
| TW | 201742249 A | 12/2017 |
| TW | I635611 B | 9/2018 |
| WO | 2015/079511 A1 | 6/2015 |

OTHER PUBLICATIONS

Sun, the specification, including the claims, and drawings in the U.S. Appl. No. 17/486,890, filed Sep. 27, 2021.

MANUFACTURING METHOD OF HIGH-VOLTAGE SEMICONDUCTOR DEVICE WITH INCREASED BREAKDOWN VOLTAGE

CROSS REFERENCE TO RELATED APPLICATIONS

This application is a divisional application of U.S. application Ser. No. 16/540,067 filed Aug. 14, 2019, which is a continuation of International Application No. PCT/CN2019/076414 filed Feb. 28, 2019, the entire contents of which are incorporated herein by reference.

BACKGROUND

The present disclosure relates to a manufacturing method of a semiconductor device, and more particularly, to a manufacturing method of a high voltage semiconductor device with an increased breakdown voltage.

In general metal-oxide-semiconductor (MOS) transistors, since drain region overlaps gate electrode, electrical breakdown easily occurs at the overlapping region of the drain region and the gate electrode due to the effect of the gate induced drain leakage (GIDL). Especially, in an application of peripheral circuit of flash, for example in 3D NAND flash, higher and higher erasing voltage for trinary-level cell (TLC) or quad-level cell (QLC) is required, so the MOS transistors for controlling the TLC or QLC need higher breakdown voltage.

In order to increasing breakdown voltage of the MOS transistor, a planar high-voltage MOS transistor is developed to have an extended drain so as to exhibit a high breakdown voltage, such as drain extended MOS (DEMOS). Another method is developed to further have an isolation structure in the drain so as to increase the breakdown voltage at drain, such as lateral diffusion MOS (LDMOS). However, these methods enlarge the top-view area of the MOS transistor, which limit the reduction of the size of the device with the MOS transistors. Another method is to fabricate a gate oxide layer with a shape of staircase so as to increase the thickness of the gate oxide layer between the gate electrode and the drain region, but this method requires extra mask and extra process, thereby increasing manufacturing cost. As a result, to increasing the breakdown voltage of the MOS transistor with no enlarged area and less increased cost is always in need.

SUMMARY

Embodiments of a high voltage semiconductor device and a manufacturing method thereof are described in the present disclosure.

In some embodiments, a high voltage (HV) semiconductor device is disclosed. The HV semiconductor device includes a semiconductor substrate, a gate structure, at least one first isolation structure and at least one second isolation structure, and at least one first drift region. The semiconductor substrate has an active area, and the semiconductor substrate has a first conductivity type. The gate structure is disposed on the active area of the semiconductor substrate, and the gate structure extends along a first direction. The at least one first isolation structure and the at least one second isolation structure are disposed in the active area of the semiconductor substrate at a side of the gate structure, in which an end of the at least one second isolation structure is disposed between the at least one first isolation structure and the gate structure in a second direction perpendicular to the first direction. The at least one first drift region is disposed in the active area of the semiconductor substrate at the side of the gate structure, and the at least one first drift region has a second conductivity type complementary to the first conductivity type, in which a bottom of the at least one first isolation structure and a bottom of the at least one second isolation structure are deeper than a bottom of the at least one first drift region.

In some embodiments, the HV semiconductor device further includes at least one first doped region disposed in the at least one first drift region, and the at least one first isolation structure and the at least one second isolation structure are disposed between the at least one first doped region and the gate structure, in which the at least one first doped region has the second conductivity type.

In some embodiments, a doping concentration of the at least one first drift region is less than a doping concentration of the at least one first doped region, and an end of the at least one first isolation structure is disposed between the at least one first doped region and the at least one second isolation structure in the second direction.

In some embodiments, a length of a combination of the at least one first isolation structure and the at least one second isolation structure in the first direction is greater than or equal to a length of the at least one first doped region in the first direction.

In some embodiments, an extension line passing through an end of the at least one first doped region and paralleling the second direction cross the at least one first isolation structure, and another extension line passing through another end of the at least one first doped region opposite to the end of the at least one first doped region and paralleling the second direction cross the at least one second isolation structure.

In some embodiments, the high voltage semiconductor device further includes a third isolation structure disposed in the semiconductor substrate, wherein the third isolation structure has an opening for defining the active area.

In some embodiments, at least one of the at least one first isolation structure or the at least one second isolation structure is connected to the third isolation structure.

In some embodiments, the at least one first drift region surrounds at least one of the at least one first isolation structure or the at least one second isolation structure in a top view.

In some embodiments, the HV semiconductor device further includes at least one second doped region disposed in the active area of the semiconductor substrate at another side of the gate structure, and the at least one second doped region has the second conductivity type.

In some embodiments, the high voltage semiconductor device further includes at least one second drift region, disposed in the active area of the semiconductor substrate at the another side of the gate structure, and the at least one second doped region being disposed in the at least one second drift region, wherein the at least one second drift region has the second conductivity type, and a doping concentration of the at least one second drift region is less than a doping concentration of the at least one second doped region.

In some embodiments, the high voltage semiconductor device further includes at least one appending isolation structure disposed in the active area of the semiconductor substrate between the second doped region and the gate structure.

In some embodiments, the at least one appending isolation structure includes at least one fourth isolation structure and at least one fifth isolation structure, and a layout of the at least one fourth isolation structure and the at least one fifth isolation structure is equal to a layout of the at least one first isolation structure and the at least one second isolation structure or symmetrical to the layout of the at least one first isolation structure and the at least one second isolation structure with respect to the gate structure.

In some embodiments, a length of a combination of the at least one fourth isolation structure and the at least one fifth isolation structure in the first direction is greater than or equal to a length of the second doped region in the first direction.

In some embodiments, a method for manufacturing a high voltage semiconductor device is disclosed and includes providing a semiconductor substrate having a first conductivity type, wherein the semiconductor substrate has an active area; forming at least one first isolation structure and at least one second isolation structure in the active area of the semiconductor substrate; forming a gate structure on the active area of the semiconductor substrate and at a side of the at least one first isolation structure, wherein the gate structure extends along a first direction, and an end of the at least one second isolation structure is disposed between the at least one first isolation structure and the gate structure in a second direction perpendicular to the first direction; and forming at least one first drift region in the active area of the semiconductor substrate at a side of the gate structure, and the at least one first drift region having a second conductivity type complementary to the first conductivity type, wherein a bottom of the at least one first isolation structure and a bottom of the at least one second isolation structure are deeper than a bottom of the first drift region.

In some embodiments, the method further includes forming a first doped region in the at least one first drift region, wherein the at least one first doped region has the second conductivity type.

In some embodiments, a doping concentration of the at least one first drift region is less than a doping concentration of the at least one first doped region, and an end of the at least one first isolation structure is disposed between the at least one first doped region and the at least one second isolation structure in the second direction.

In some embodiments, a length of a combination of the at least one first isolation structure and the at least one second isolation structure in the first direction is greater than or equal to a length of the at least one first doped region in the first direction.

In some embodiments, forming the at least one first isolation structure and the at least one second isolation structure comprises forming a third isolation structure in the semiconductor substrate, wherein the third isolation structure has an opening defining the active area.

In some embodiments, at least one of the at least one first isolation structure or the at least one second isolation structure is connected to the third isolation structure.

In some embodiments, forming the at least one first doped region includes forming at least one second doped region in the active area of the semiconductor substrate at another side of the gate structure, and the at least one second doped region having the second conductivity type.

In some embodiments, forming the first drift region further comprises forming at least one second drift region in the active area of the semiconductor substrate at the another side of the gate structure, and the at least one second doped region being disposed in the at least one second drift region, wherein the at least one second drift region has the second conductivity type, and a doping concentration of the at least one second drift region is less than a doping concentration of the at least one second doped region.

In some embodiments, forming the at least one first isolation structure and the at least one second isolation structure further includes forming at least one appending isolation structure in the active area of the semiconductor substrate between the at least one second doped region and the gate structure.

In some embodiments, the at least one appending isolation structure includes at least one fourth isolation structure and at least one fifth isolation structure, and a layout of the at least one fourth isolation structure and the at least one fifth isolation structure is equal to a layout of the at least one first isolation structure and the at least one second isolation structure or symmetrical to the layout of the at least one first isolation structure and the at least one second isolation structure with respect to the gate structure.

These and other objectives of the present disclosure will no doubt become obvious to those of ordinary skill in the art after reading the following detailed description of the preferred embodiment that is illustrated in the various figures and drawings.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

FIG. 5A-FIG. 6A schematically illustrate top views of exemplary structures at different steps of the exemplary method.

FIG. 5B-FIG. 6B schematically illustrate sectional views of exemplary structures at different steps of the exemplary method.

Figure 1A:
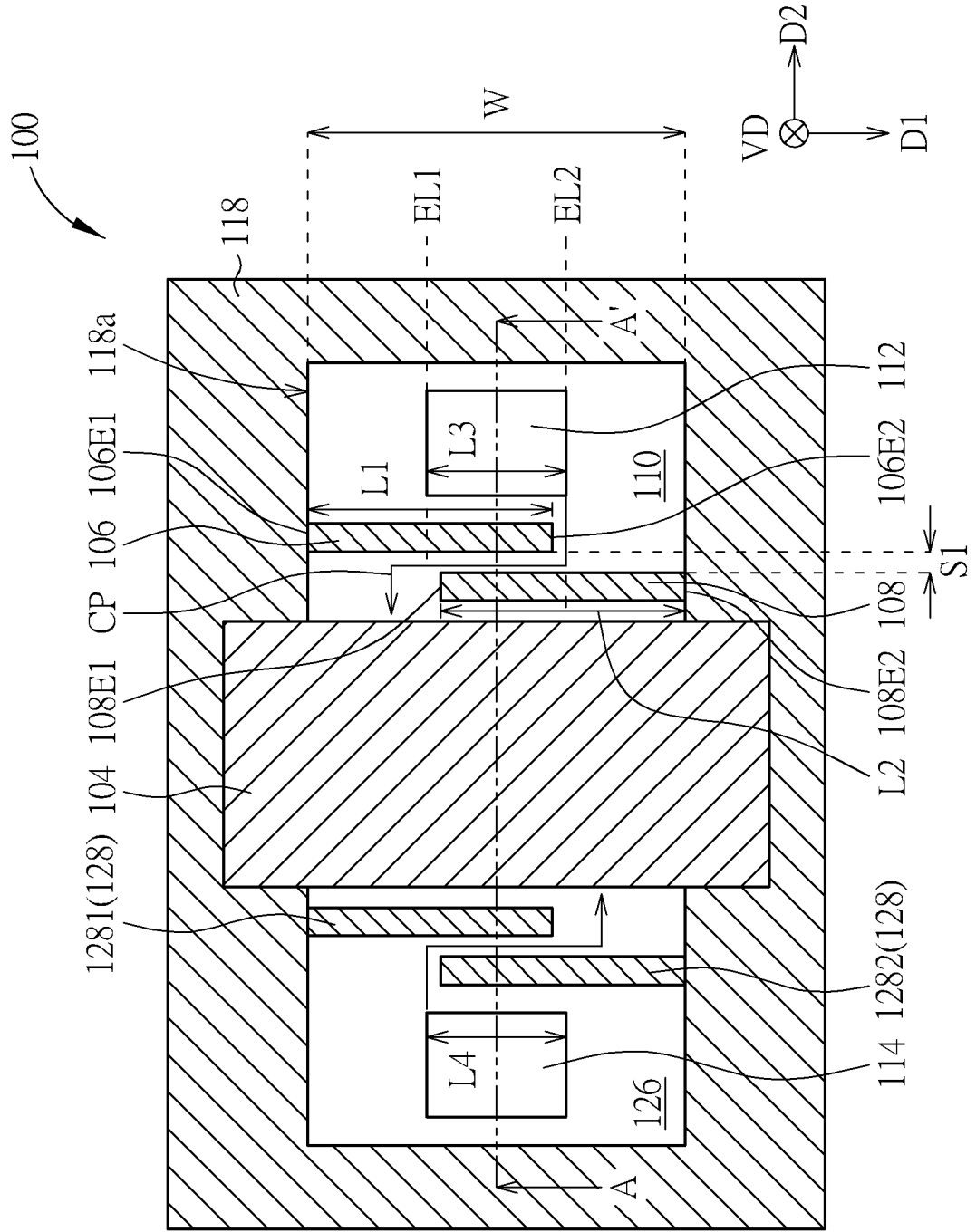
FIG. 1A is a schematic diagram illustrating a top view of an exemplary HV semiconductor device according to a first embodiment of the present disclosure.

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to effect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc.

As used herein, the term "substantially" refers to a desired, or target value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject photomask structure. Based on the particular technology node, the term "about" can indicate a value of a given quantity that varies within, for example, 10-30% of the value (e.g., ±10%, ±20%, or ±30% of the value).

As used throughout this application, the word "may" is used in a permissive sense (e.g., meaning having the potential to), rather than the mandatory sense (e.g., meaning must). The words "include", "including", and "includes" indicate open-ended relationships and therefore mean including, but not limited to. Similarly, the words "have", "having", and "has" also indicated open-ended relationships, and thus mean having, but not limited to. The terms "first", "second", "third," and so forth as used herein are meant as labels to distinguish among different elements and may not necessarily have an ordinal meaning according to their numerical designation.

In the present disclosure, different technical features in different embodiments described in the following description can be combined, replaced, or mixed with one another to constitute another embodiment.

In the present disclosure, following exemplary high voltage (HV) semiconductor devices of embodiments may be implemented in any kind of semiconductor device, such as a peripheral circuit of flash memory, power device or other suitable devices.

Figure 1B:
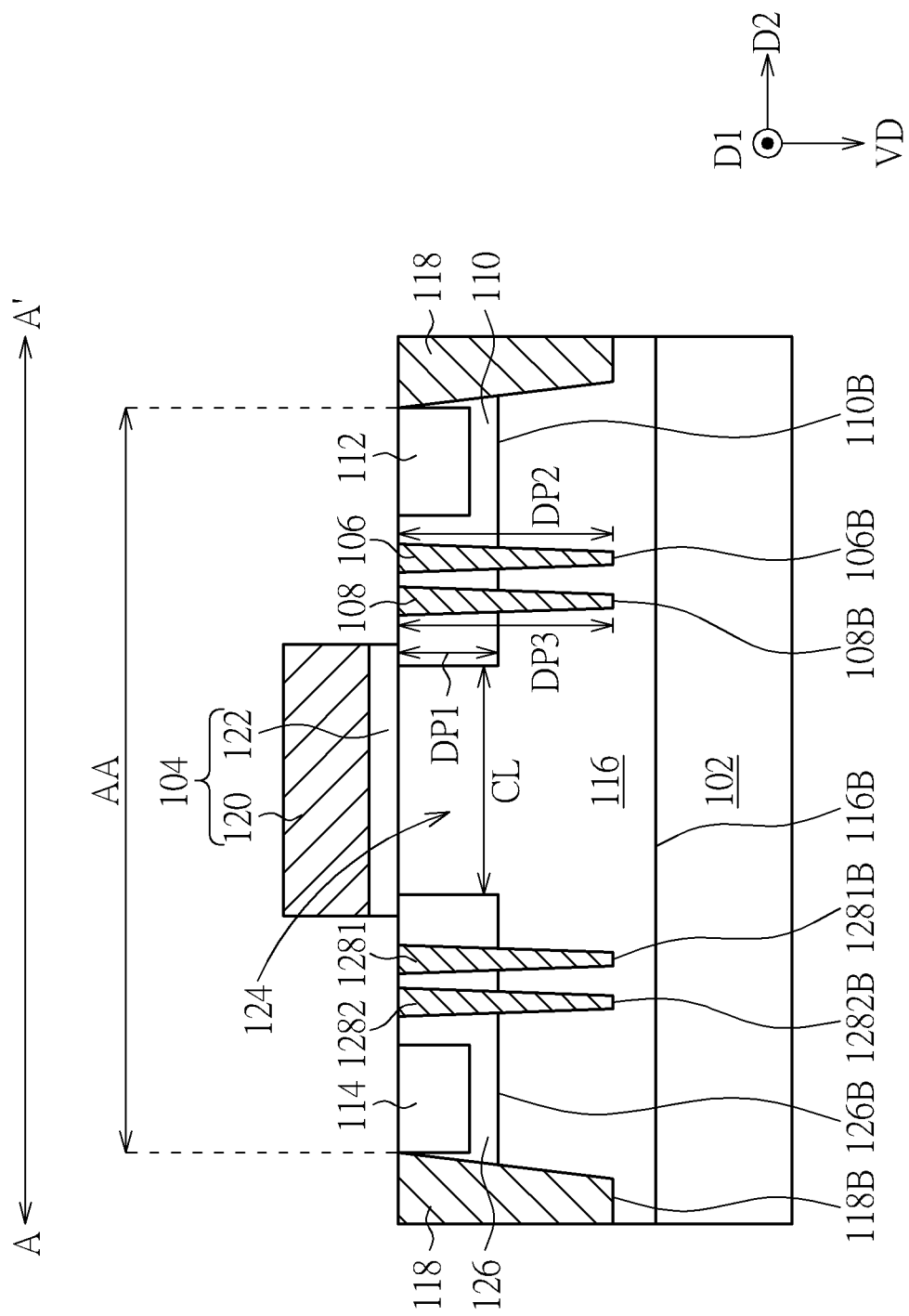
FIG. 1B schematically illustrates a sectional view of the exemplary HV semiconductor device taken along a sectional line A-A' of FIG. 1A.

FIG. 1A is a schematic diagram illustrating a top view of an exemplary HV semiconductor device according to a first embodiment of the present disclosure, and FIG. 1B schematically illustrates a sectional view of the exemplary HV semiconductor device taken along a sectional line A-A' of FIG. 1A. As shown in FIG. 1A and FIG. 1B, the HV semiconductor device 100 includes a semiconductor substrate 102, a gate structure 104, at least one first isolation structure 106, at least one second isolation structure 108, at least one first drift region 110, at least one first doped region 112, and at least one second doped region 114. The semiconductor substrate 102 has an active area AA for forming the HV semiconductor device 100. In some embodiments, the semiconductor substrate 102 may optionally include a well region 116 having a first conductivity type formed therein, and the well region 116 may serve as a base of the HV semiconductor device 100. In this situation, the semiconductor substrate 102 may have the first conductivity type or a second conductivity type complementing the first conductivity type, but the present disclosure is not limited thereto. The threshold voltage of the HV semiconductor device 100 can be adjusted for example based on the doping concentration of the well region 116. When the semiconductor substrate 102 has the same conductivity type as the well region 116, a doping concentration of the well region 116 may be greater than that of the semiconductor substrate 102, but not limited thereto. In some embodiments, the well region 116 may cover the active area AA in a top view. In some embodiments, the semiconductor substrate 102 may not include the well region formed therein, and the semiconductor substrate 102 has the first conductivity type serves as the base of the HV semiconductor device 100. In some embodiments, the semiconductor substrate 102 includes any suitable material for forming the HV semiconductor device 100. For example, the semiconductor substrate 102 may include silicon, silicon germanium, silicon carbide, silicon on insulator (SOI), germanium on insulator (GOI), glass, gallium nitride, gallium arsenide, and/or other suitable III-V compound, but not limited thereto. In the present disclosure, the top view may be referred to as a vertical direction VD perpendicular to a top surface of the semiconductor substrate 102.

In some embodiments, the HV semiconductor device 100 may optionally further include a third isolation structure 118 that has an opening 118a for defining the active area AA. For example, the third isolation structure 118 surrounds the elements of the HV semiconductor device 100, such that the third isolation structure 118 may insulate the HV semiconductor device 100 from other devices formed in the same semiconductor substrate 102. In some embodiments, the third isolation structure 118 may be a shallow trench isolation (STI) or other suitable kinds of isolation structures.

The gate structure 104 is disposed on the active area AA of the semiconductor substrate 102. In this embodiment, the gate structure 104 may be a strip-shaped structure extending along a first direction D1 and across the active area AA. In some embodiments, the gate structure 104 may not be across the active area AA. In some embodiments, the gate structure 104 may include a gate electrode 120 serving as a gate of the HV semiconductor device 100 and a gate dielectric layer 122 disposed between the gate electrode 120 and the semiconductor substrate 102. In some embodiments, the gate structure 104 may further include spacer disposed at sidewalls of the gate electrode 120 and the gate dielectric layer 122.

The first isolation structure 106 and the second isolation structure 108 are disposed in the active area AA of the semiconductor substrate 102 at a side of the gate structure 104 and spaced apart from each other by a space S1. In this embodiment, the HV semiconductor device 100 may include one first isolation structure 106 and one second isolation structure 108, but not limited thereto. The number of the first isolation structure 106 and the number of the second isolation structure 108 may be adjusted according to the requirement of device characteristic. The first isolation structure 106 and the second isolation structure 108 may for example a strip-shaped structure extending along the first direction D1. In the top view, an end 108E1 of the second isolation structure 108 is disposed between the first isolation structure 106 and the gate structure 104 in a second direction D2 perpendicular to the first direction D1. In other words, the second isolation structure 108 and the first isolation structure 106 are arranged in the second direction D2 with an offset in the first direction D1. In some embodiments, the first isolation structure 106 may be disposed between the gate structure 104 and the second isolation structure 108. In some embodiments, at least one of the first isolation structure 106 or the second isolation structure 108 may be connected to the third isolation structure 118. For example, an end 106E1 of the first isolation structure 106 may be connected to the third isolation structure 118, and/or another end 108E2 of the second isolation structure 108 opposite to the end 108E1 disposed between the first isolation structure 106 and the gate structure 104 may be connected to the third isolation structure 118. A length L1 of the first isolation structure 106 in the first direction D1 and a length L2 of the second isolation structure 108 are respectively less than a width W of the active area AA in the first direction D1. In some embodiments, the length L1 of the first isolation structure 106 may be identical to or different from the length L2 of the second isolation structure 108 according to the requirements of device characteristics. In some embodiments, the first isolation structure 106 and the second isolation structure 108 may respectively be a STI or other suitable kinds of isolation structures. A width of the first isolation structure 106 and a width of the second isolation structure 108 in the second direction D2 may be adjusted according to the requirements of device characteristics.

The first drift region 110 is disposed in the active area AA of the semiconductor substrate 102 and on at least three sides of the first isolation structure 106 and on at least three sides of the second isolation structure 108 in the top view, and the first isolation structure 106 and the second isolation structure 108 vertically penetrate through the first drift region 110 (in the vertical direction VD). In other words, a bottom 106B of the first isolation structure 106 and a bottom 108B of the second isolation structure 108 are respectively deeper than a bottom 110B of the first drift region 110. Thus, the first drift region 110 is laterally disposed beside the first isolation structure 106 and the second isolation structure 108 instead of extending to be under the first isolation structure 106 and the second isolation structure 108, so a top view shape of the first drift region 110 may be or be like Z-shaped, but not limited thereto. The first isolation structure 106 and the second isolation structure 108 may have the same depth or different depths. The first drift region 110 may have a second conductivity type complementary to the first conductivity type. In some embodiments, the first drift region 110 may partially overlap the gate structure 104 in the top view. In some embodiments, a width of the first drift region 110 in the first direction D1 may be defined by the opening 118a of the third isolation structure 118 and accordingly may be substantially equal to the width W of the active area AA in the first direction D1.

The first doped region 112 is disposed in the first drift region 110 and encompassed by the first drift region 110, and the first isolation structure 106 and the second isolation structure 108 are disposed between the first doped region 112 and the gate structure 104. The first doped region 112 has the second conductivity type, and a doping concentration of the first drift region 110 is less than a doping concentration of the first doped region 112. The first doped region 112 may serve as a drain/source of the HV semiconductor device 100. In one embodiment, the first doped region 112 may be used as a drain/source terminal of the HV semiconductor device 100 for being connected to other outer devices or a power source; that is to say the first drift region 110 is electrically connected to the other outer devices only through the first doped region 112. In some embodiments, the HV semiconductor device 100 may include a plurality of first doped region 112 arranged in the first direction D1.

A length of a combination of the first isolation structure 106 and the second isolation structure 108 in the first direction D1 (that is a total length of a projection of the combination of the first isolation structure 106 and the second isolation structure 108 projected on the first direction D1) is greater than or equal to a length L3 of the first doped region 112 in the first direction D1. The length of the combination may also be a space between the end 106E1 of the first isolation structure 106 and the end 108E2 of the second isolation structure 108. For this reason, an extension line EL1 passing through an end of the first doped region 112 and paralleling the second direction D2 may cross the first isolation structure 106, and another extension line EL2 passing through another end of the first doped region 112 opposite to the end and paralleling the second direction D2 may cross the second isolation structure 108. In this embodiment, the end 106E1 of the first isolation structure 106 is connected to a sidewall of the opening 118a of the third isolation structure 118, and the end 108E2 of the second isolation structure 108 is connected to an opposite side of the opening 118a of the third isolation structure 118, so the length of a combination of the first isolation structure 106 and the second isolation structure 108 in the first direction D1 may be equal to the width W of the active area AA. Since the first isolation structure 106 and the second isolation structure 108 vertically penetrates the first drift region 110, current from the first doped region 112 to the semiconductor substrate 102 or well region 116 under the gate structure 104 (channel region 124) will laterally flow through the first drift region 110 between the end 106E2 and the third isolation structure 118, the first drift region 110 in a space between the first isolation structure 106 and the second isolation structure 108 and the first drift region 110 between the end 108E1 and the third isolation structure 118. Also, because the end 108E1 of the second isolation structure 108 is disposed between the first isolation structure 106 and the gate structure 104 (i.e. the first isolation structure 106 and the second isolation structure 108 overlap each other in the second direction D2), the current path CP from the first doped region 112 to the channel region 124 can be increased, thereby enhancing the breakdown voltage at the drain/source of the HV semiconductor device 100 without enlarging the size of the HV semiconductor device 100. The length of the current path CP can be adjusted by the overlapping area of the first isolation structure 106 and the second isolation structure 108 in the second direction D2. In some embodiments, the length L1 of the first isolation structure 106 and/or the length L2 of the second isolation structure 108 may be greater than or less than the length L3 of the first doped region 112.

The second doped region 114 is disposed in the active area AA of the semiconductor substrate 102 at another side of the gate structure 104 opposite to the first drift region 110. The second doped region 114 has the second conductivity type and may serve as a source/drain of the HV semiconductor device 100, which means the second doped region 114 may be used as a source/drain terminal of the HV semiconductor device 110 for being connected to other outer devices or a power source. In some embodiments, a doping concentration of the second doped region 114 may be identical to or different from the doping concentration of the first doped region 112 according to the design requirements.

In some embodiments, the HV semiconductor device 100 may optionally further include at least one second drift region 126 disposed in the active area AA of the semiconductor substrate 102 at the side of the gate structure 104 facing the second doped region 114, and the second doped region 114 is disposed in the second drift region 126 and encompassed by the second drift region 126. In such situation, the second drift region 126 has the second conductivity type, a doping concentration of the second drift region 126 is less than the doping concentration of the second doped region 114, and the second drift region 126 is electrically connected to the other outer devices only through the second doped region 114. In some embodiments, the second drift region 126 may partially overlap the gate structure 104 in the top view. In this situation, the semiconductor substrate 102 or the well region 116 between the first drift region 110 and the second drift region 126 and under the gate structure 104 may form the channel region 124 of the HV semiconductor device 100. In some embodiments, a width of the second drift region 126 in the first direction D1 may be substantially equal to the width W of the active area AA. In some embodiments, the doping concentration of the second drift region 126 may be identical to or different from the doping concentration of the first drift region 110 based on the desired breakdown voltages at drain and source.

In some embodiments, the HV semiconductor device 100 may optionally further include at least one appending isolation structure 128 disposed in the active area AA of the semiconductor substrate 102 at the side of the gate structure 104 facing the second doped region 114. In this embodiment, the HV semiconductor device 100 may include one first isolation structure 106 and one second isolation structure 108, but not limited thereto. The appending isolation structure 128 is disposed between the second doped region 114 and the gate structure 104. In some embodiments, the number of the appending isolation structure 128 may be one or plural. In some embodiments, the structure of the at least one appending isolation structure 128 may be symmetrical to or not symmetrical to a combination of the first isolation structure 106 and the second isolation structure 108 with respect to the gate structure 104. In some embodiments, the appending isolation structure 128 may respectively be a STI or other suitable isolation structures.

In this embodiment, the at least one appending isolation structure 128 includes at least one fourth isolation structure 1281 and at least one fifth isolation structure 1282 separated from each other as an example in the following description, but the present disclosure is not limited thereto. The fourth isolation structure 1281 may be the same as the first isolation structure 106, and the fifth isolation structure 1282 may be the same as the second isolation structure 108, so a layout of the fourth isolation structure 1281 and the fifth isolation structure 1282 may be equal to a layout of the first isolation structure 106 and the second isolation structure 108, and the fourth isolation structure 1281 and the fifth isolation structure 1282 may also vertically penetrate through the second drift region 126 (in the vertical direction VD), i.e. a bottom 1281B of the fourth isolation structure 1281 and a bottom 1282B of the fifth isolation structure 1282 may be deeper than a bottom 126B of the second drift region 126. Accordingly, a top view shape of the second drift region 126 may be or be like Z-shaped, but not limited thereto.

Figure 2:
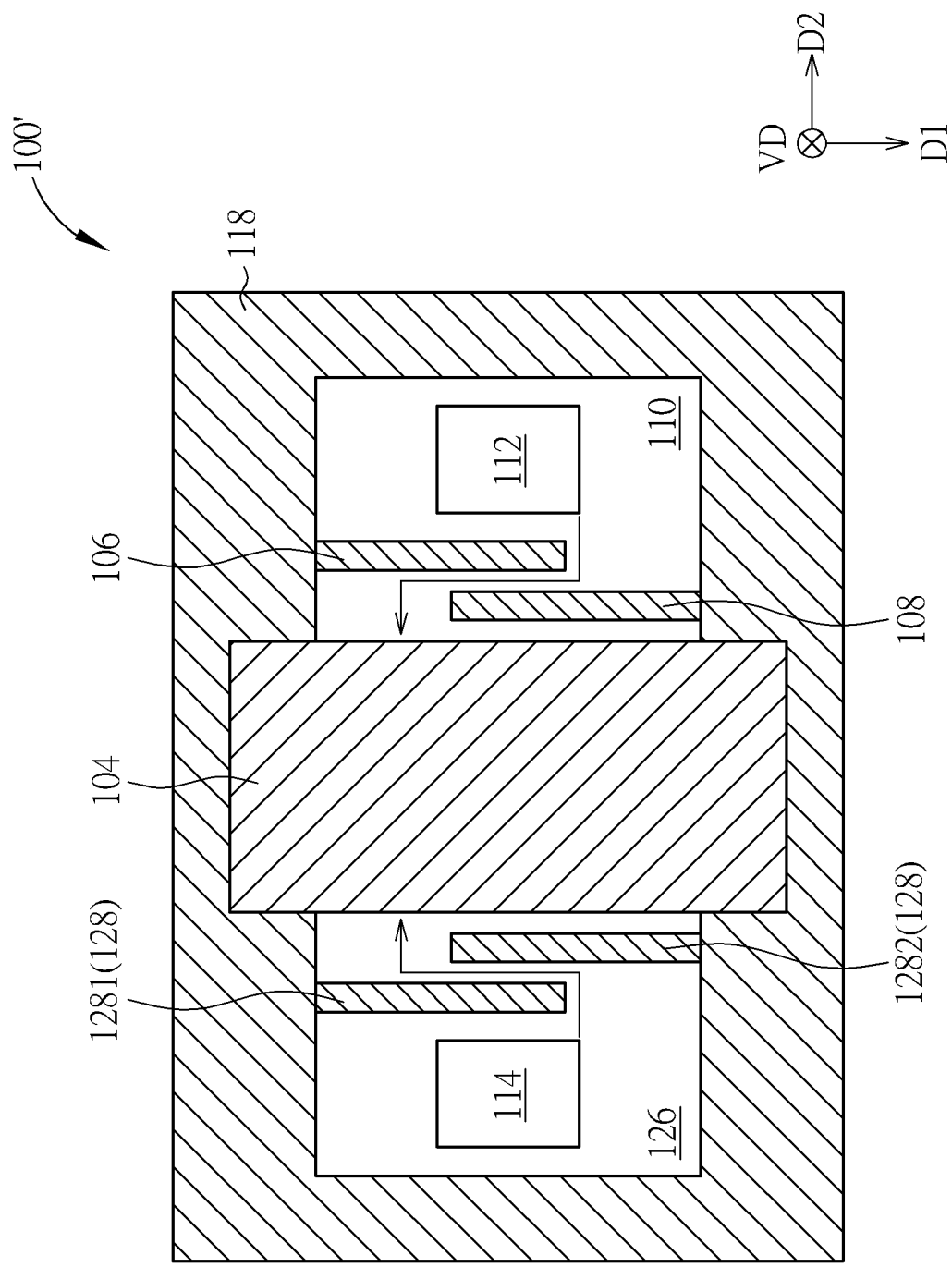
FIG. 2 is a schematic diagram illustrating a top view of an exemplary HV semiconductor device according to some embodiments of the present disclosure.

As shown in FIG. 2, in a HV semiconductor device 100' of some embodiments, the layout of the fourth isolation structure 1281 and the fifth isolation structure 1282 may be symmetrical to the layout of the first isolation structure 106 and the second isolation structure 108 with respect to the gate structure 104. In some embodiments, the fifth isolation structure 1282 may be disposed between the gate structure 104 and the fourth isolation structure 1281.

Refer to FIG. 1A and FIG. 1B again. A length of a combination of the fourth isolation structure 1281 and the fifth isolation structure 1282 in the first direction D1 (that is a total length of a projection of the combination of the fourth isolation structure 1281 and the fifth isolation structure 1282 projected on the first direction D1) is greater than or equal to a length L4 of the second doped region 114 in the first direction D1. Specifically, in this embodiment, an end of the fourth isolation structure 1281 is connected to a sidewall of the opening 118a of the third isolation structure 118, and an end of the fifth isolation structure 1282 is connected to an opposite side of the opening 118a of the third isolation structure 118, so the length of the combination of the fourth isolation structure 1281 and the fifth isolation structure 1282 in the first direction D1 is equal to the width W of the active area AA. In some embodiments, a width of the fourth isolation structure 1281 and a width of the fifth isolation structure 1282 in the second direction D2 may also be adjusted according to the requirements of device characteristics. In some embodiments, the first doped region 112, the first drift region 110, the first isolation structure 106 and the second isolation structure 108 may be respectively symmetrical to the second doped region 114, the second drift region 126, the fourth isolation structure 1281 and the fifth isolation structure 1282 with respect to the gate structure 104.

Since the fourth isolation structure 1281 and the fifth isolation structure 1282 are similar to or have the same structure as the first isolation structure 106 and the second isolation structure 108, the fourth isolation structure 1281 and the fifth isolation structure 1282 may have the same function as the first isolation structure 106 and the second isolation structure 108. Accordingly, the disposition of the fourth isolation structure 1281 and the fifth isolation structure 1282 can reduce the effect of the electric field from the second doped region 114 on the gate structure 104, thereby enhancing the breakdown voltage at the source/drain of the HV semiconductor device 100 without enlarging the size of the HV semiconductor device 100.

In some embodiments, the first conductivity type and the second conductivity type are respectively p-type and n-type, and therefore the HV semiconductor device 100 is an n-type transistor, but not limited thereto. In some embodiments, the first conductivity type and the second conductivity type may also be n-type and p-type respectively, so the HV semiconductor device 100 is a p-type transistor.

As the HV semiconductor device 100 mentioned above, since the first isolation structure 106 and the second isolation structure 108 vertically penetrate the first drift region 110, and the end 108E1 of the second isolation structure 108 is disposed between the first isolation structure 106 and the gate structure 104 in the second direction D2, the breakdown voltage at drain/source can be significantly increased. Similarly, the disposition of the fourth isolation structure 1281 and the fifth isolation structure 1282 can significantly increase the breakdown voltage at source/drain. The depths of the first, second, third, fourth and fifth isolation structure 106, 108, 118, 1281, 1282 may be for example 300 nm respectively. It is noted that since the depth DP1 of the first drift region 110 is less than the depth DP2 of the first isolation structure 106 and the depth DP3 of the second isolation structure 108, i.e. the first isolation structure 106 and the second isolation structure 108 vertically penetrate the first drift region 110, a channel length CL of the channel region 124 of the HV semiconductor device 100 may be controlled to be about 1 μm. If the depth of the first drift region is fabricated to be greater than the first isolation structure, such as greater than 300 nm, the channel length of the channel region needs to be enlarged to be greater than 2 μm, thereby limit the reduction of the size of the HV semiconductor device. However, in the HV semiconductor device 100 of this embodiment, by means of the depth DP2 of the first isolation structure 106 and the depth DP3 of the second isolation structure 108 being greater than the depth DP2 of the first drift region 110, not only the breakdown voltage can be increased, but also the channel length CL of the channel region 124 can be maintained or reduced.

Figure 3:
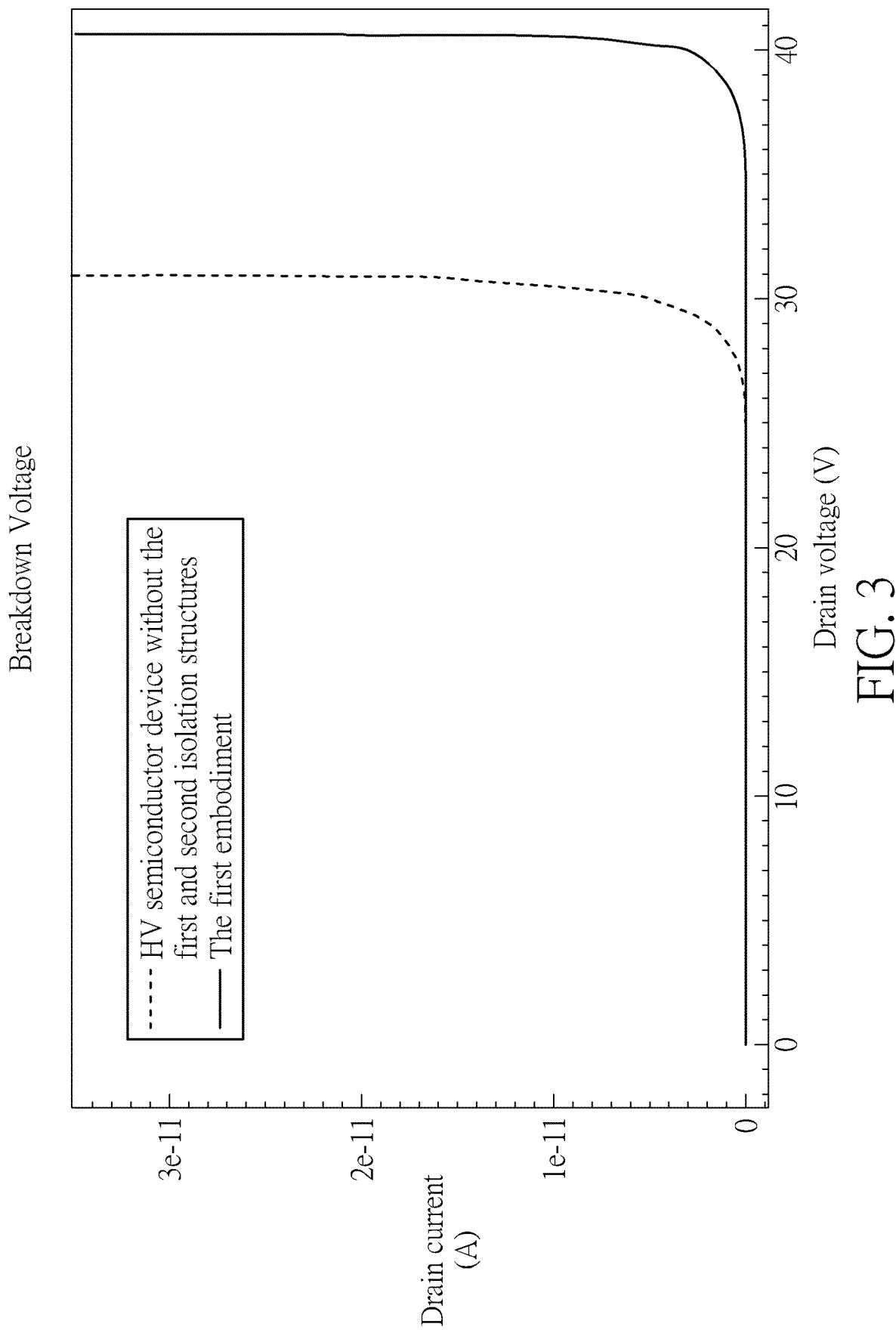
FIG. 3 schematically illustrates breakdown voltages of the HV semiconductor device according to the first embodiment and a HV semiconductor device without the first isolation structure.

FIG. 3 schematically illustrates breakdown voltages of the HV semiconductor device according to the first embodiment and a HV semiconductor device without the first isolation structure and the second isolation structure. As shown in FIG. 3, the HV semiconductor device without the first isolation structure and the second isolation structure may have the breakdown voltage of about 30V at drain, but the HV semiconductor device 100 of the above embodiment with the first isolation structure 106 and the second isolation structure 108 may have the breakdown voltage of about 40V at drain. For this reason, the breakdown voltage of the HV semiconductor device 100 of the above embodiment is significant increased.

Figure 4:
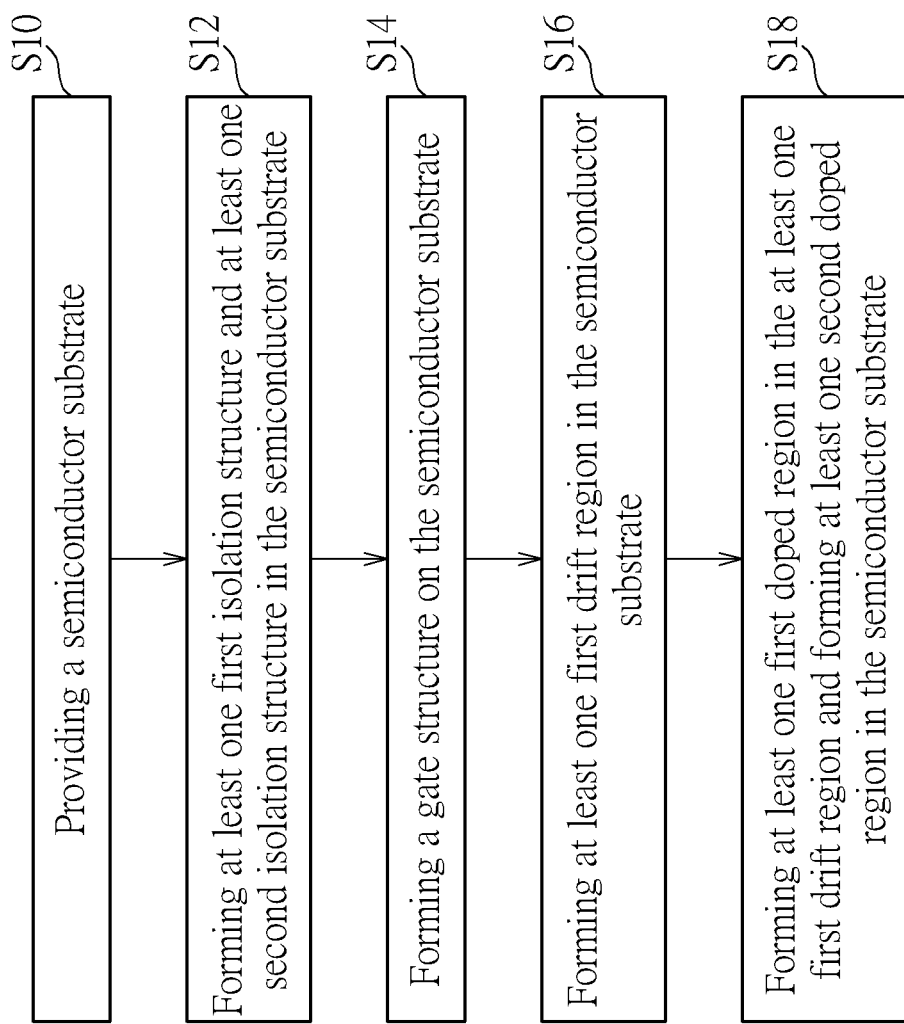
FIG. 4 schematically illustrates a flowchart of an exemplary method for manufacturing the HV semiconductor device according to the first embodiment.
Figure 5A:
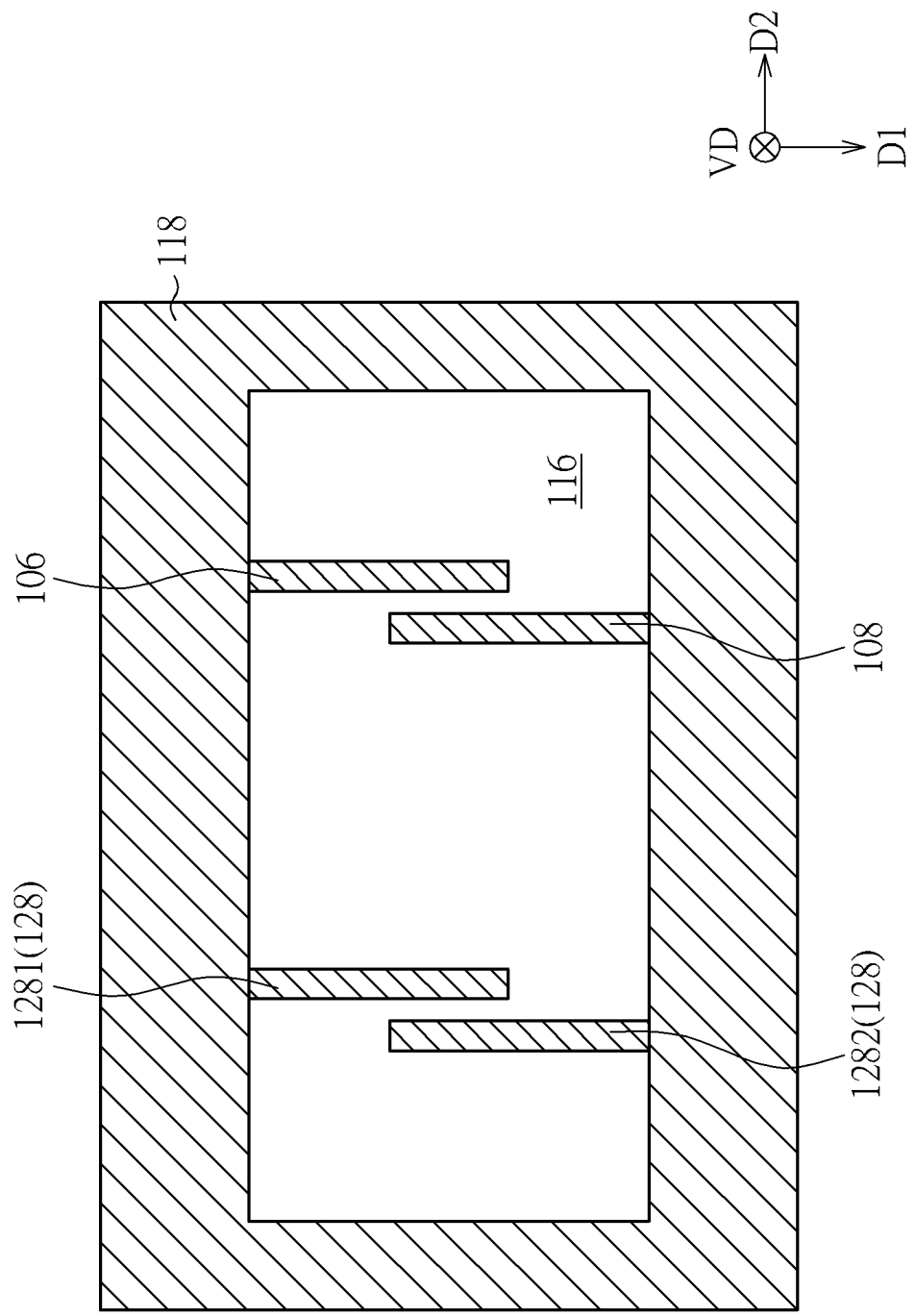
Figure 5B:
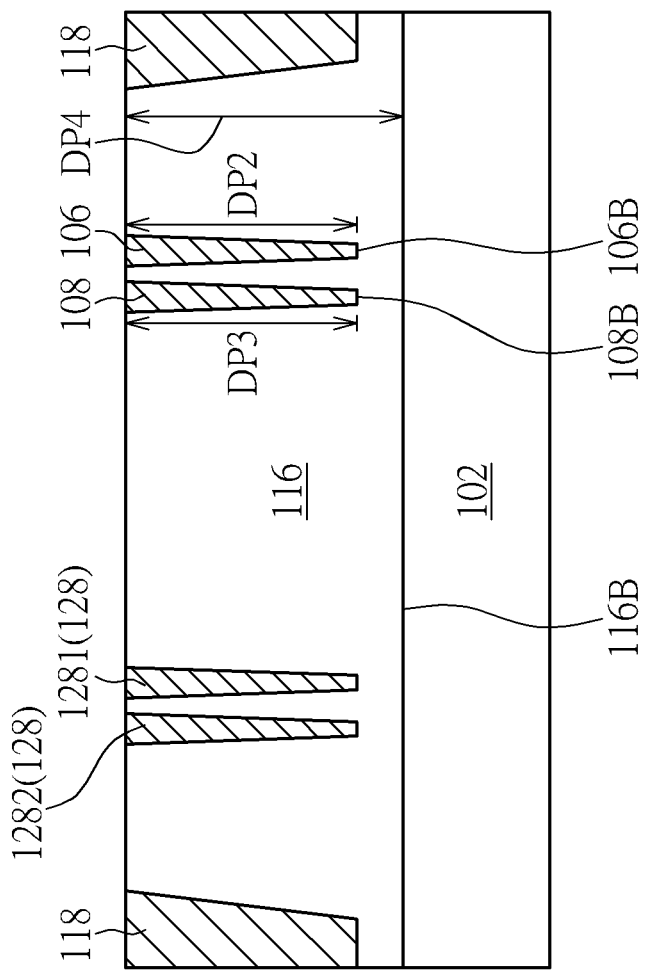

FIG. 4 schematically illustrates a flowchart of an exemplary method for manufacturing the HV semiconductor device according to the first embodiment. FIG. 5A-FIG. 6A and FIG. 1A schematically illustrate top views of exemplary structures at different steps of the exemplary method. FIG. 5B-FIG. 6B and FIG. 1B schematically illustrate sectional views of exemplary structures at different steps of the exemplary method. The method for manufacturing the HV semiconductor device of this embodiment includes but not limited to the following steps. First, as shown in FIG. 4, FIG. 5A and FIG. 5B, a step S10 is performed to provide the semiconductor substrate 102. In some embodiments, the step of providing the semiconductor substrate 102 may further include forming the well region 116 in the semiconductor substrate 102. After that, a step S12 is performed to format least one first isolation structure 106 and at least one second isolation structure 108. In some embodiments, the step of forming the first isolation structure 106 may include forming the third isolation structure 118 in the semiconductor substrate 102 for defining the active area AA. In some embodiments, the step of forming the first isolation structure 106 may optionally further include forming the appending structure 128, for example the fourth isolation structure 1281 and the fifth isolation structure 1282, in the semiconductor substrate 102, i.e. the first isolation structure 106, the second isolation structure 108, the third isolation structure 118, the fourth isolation structure 1281 and the fifth isolation structure 1282 may be formed at the same time. Thus, the bottoms of these isolation structures may be located at a same level, and the depths of the isolation structures may be identical. In some embodiments, the bottom 106B of the first isolation structure 106 may be shallower than the bottom 116B of the well region 116, i.e. the depth DP2 of the first isolation structure 106 may be less than the depth DP4 of the well region 116. Since the first isolation structure 106, the second isolation structure 108, the fourth isolation structure 1281 and the fifth isolation structure 1282 for increasing the breakdown voltage are formed with the third isolation structure 118 for defining the active area AA, no extra step is required to form them, and cost for forming them can be saved.

Figure 6A:
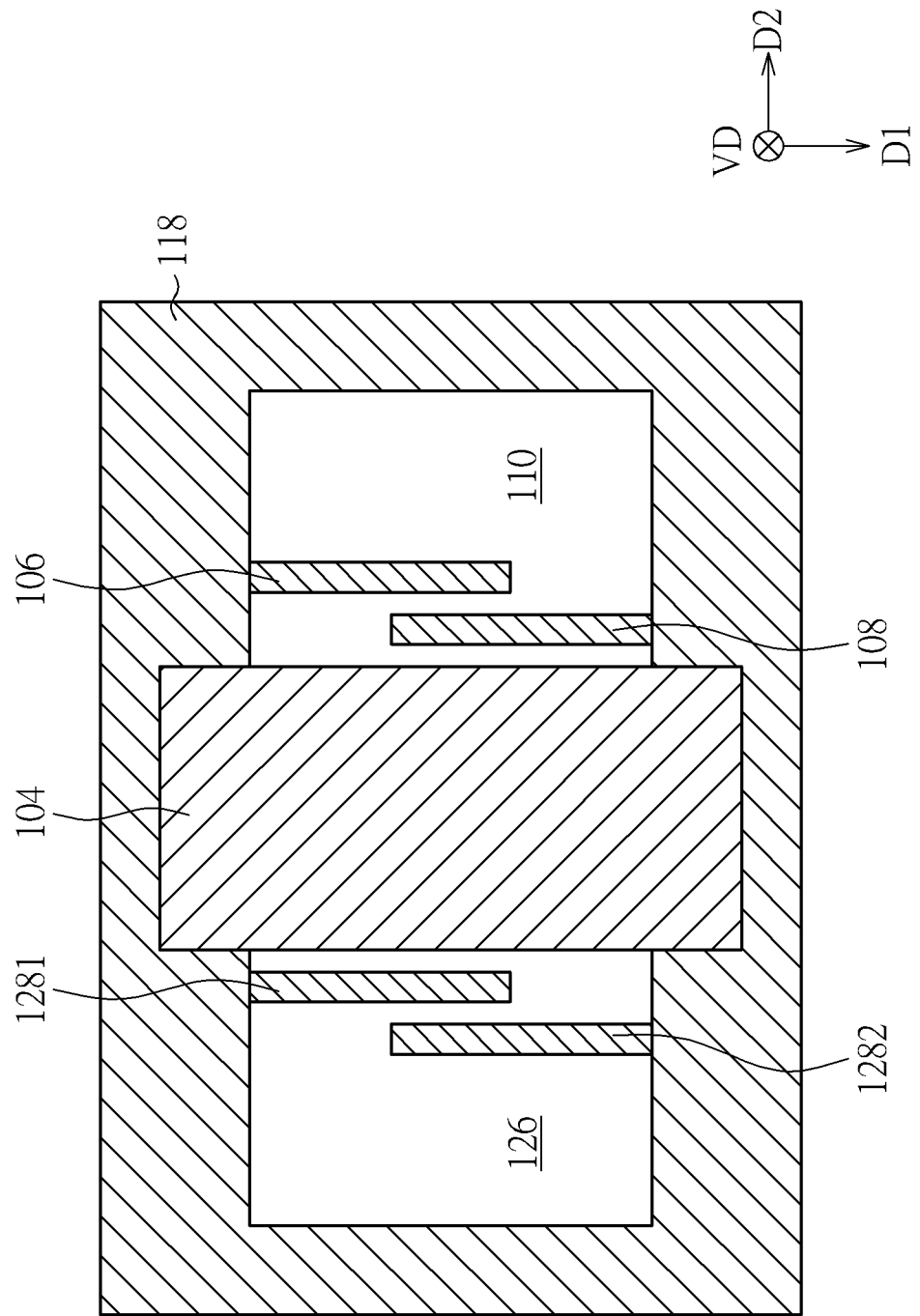
Figure 6B:
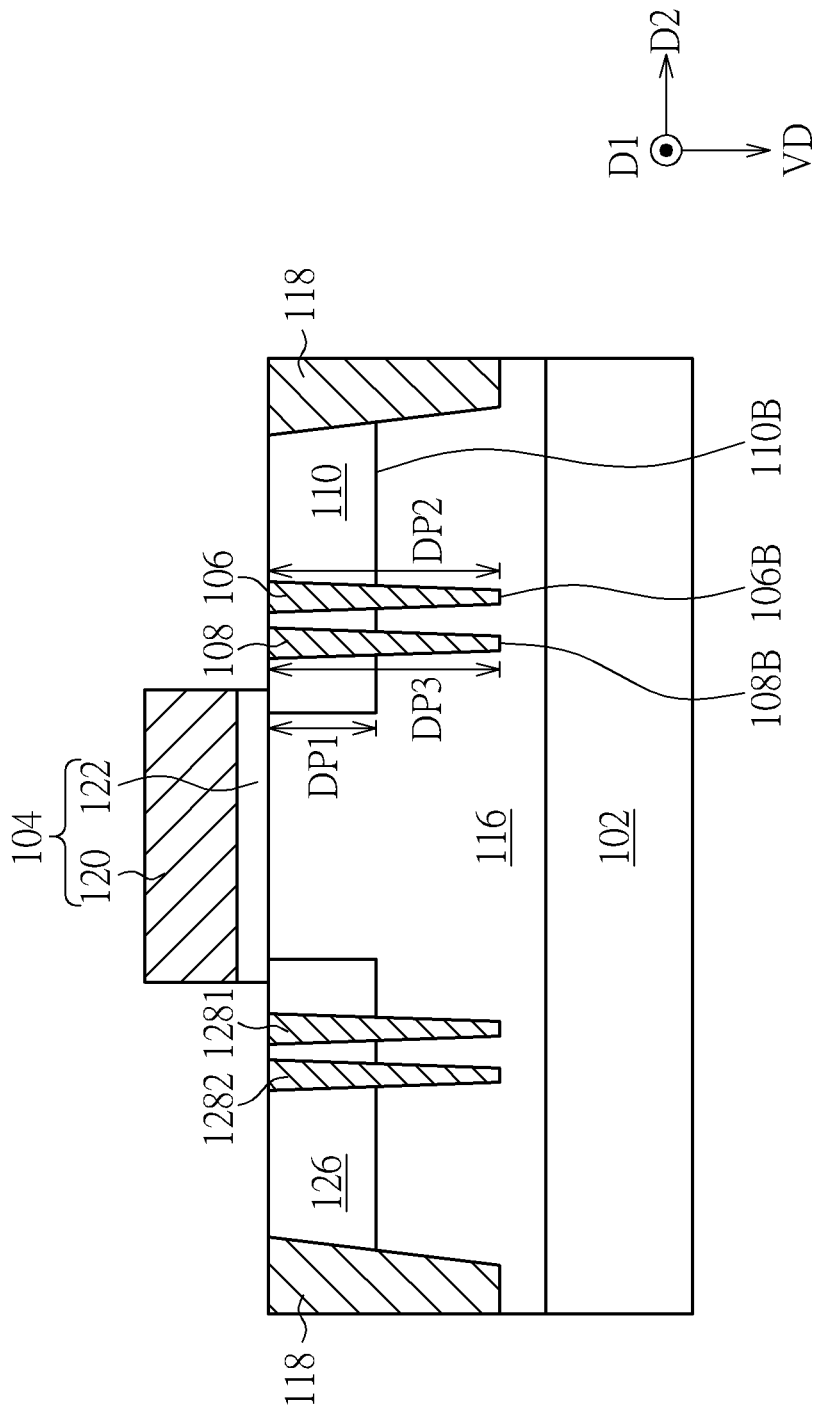

Subsequently, as shown in FIG. 4, FIG. 6A and FIG. 6B, a step S14 is performed to forming the gate structure 104 on the semiconductor substrate 102. Specifically, a dielectric layer and a conductive layer may be sequentially stacked on the semiconductor substrate 102, and then, the conductive layer and the dielectric layer are patterned in one step or different steps to form the gate electrode 120 and the gate dielectric layer 122. In some embodiments, the step of forming the gate structure 104 may further include forming spacer surrounding the gate electrode 120 and the gate dielectric layer 122. After the gate structure 104 is formed, a step S16 is performed to form the at least one first drift region 110 in the active area AA of the semiconductor substrate 102 at a side of the gate structure 104. In some embodiments, the step of forming the first drift region 110 may further include forming the at least one second drift region 126 in the active area AA of the semiconductor substrate 102 at another side of the gate structure 104 opposite to the first drift region 110. Accordingly, the channel region 124 can be formed between the first drift region 110 and the second drift region 126. For example, the first drift region 110 and the second drift region 126 may be formed by a self-aligning process utilizing the gate structure 104 and the above isolation structures as mask. In such situation, the channel length CL of the channel region 124 may be defined by the gate structure 104. In some embodiments, the step of forming the first drift region 110 and the second drift region 126 may be performed by utilizing an extra photomask, in such situation, the channel length CL of the channel region 124 is defined by the first drift region 110 and the second drift region 126. In some embodiments, the step of forming the first drift region 110 and the second drift region 126 may be performed before forming the isolation structures. In some embodiments, the step of forming the first drift region 110 and the second drift region 126 may be performed before forming the gate structure 104. Because the depth DP1 of the first drift region 110 is less than the depth DP2 of the first isolation structure 106 and the depth DP3 of the second isolation structure 108, the annealing time for the first drift region 110 doesn't require too long. Accordingly, for the HV semiconductor device 100 with operating voltage of about 40V, the channel length CL can be easily controlled and reduced to be about 1 μm; for the HV semiconductor device 100 with operating voltage of about ten or more voltages, the channel length CL can be reduced to be less than 1 μm or less.

As shown in FIG. 4, FIG. 1A and FIG. 1B, a step S18 is performed to form the first doped region 112 in the first drift region 110 and the second doped region 114 in the second drift region 126 by utilizing another photomask. Accordingly, the HV semiconductor device 100 of this embodiment can be formed. Since the first doped region 112 and the second doped region 114 are not formed by means of utilizing the above isolation structures as mask, the formed first doped region 112 may be spaced apart from the first isolation structure 106, and the formed second doped region 114 may be spaced apart from the third isolation structure 136. In some embodiments, the gate structure 104 may be formed by a gate-last process, so the gate structure 104 may be formed after the formation of the first doped region 112 and the second doped region 114.

The HV semiconductor device and the manufacturing method thereof are not limited to the aforementioned embodiment and may have other different preferred embodiments. To simplify the description, the identical components in each of the following embodiments are marked with identical symbols. For making it easier to compare the differences between the embodiments, the following description will detail the dissimilarities among different embodiments and the identical features will not be redundantly described.

Figure 7:
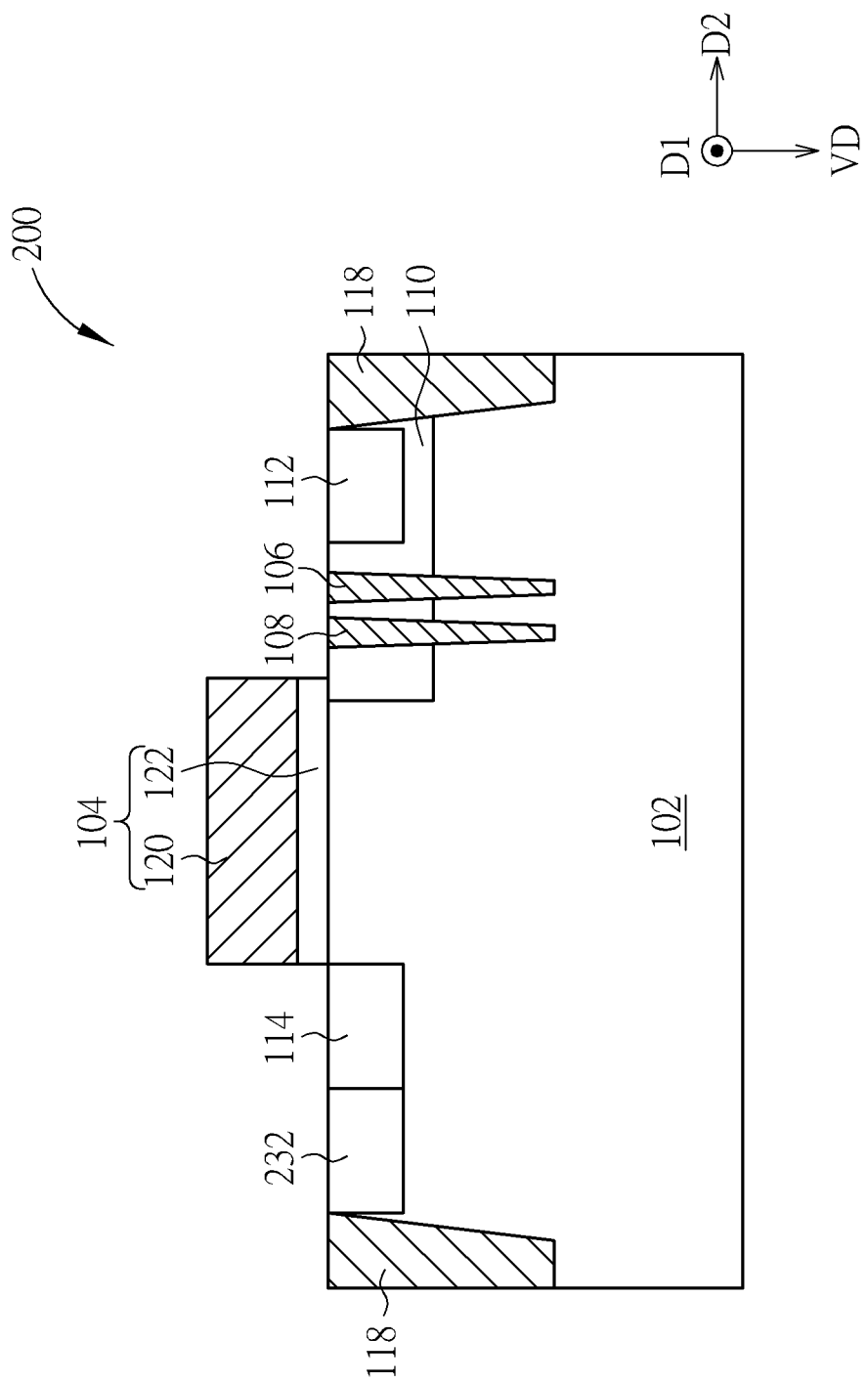
FIG. 7 is a schematic diagram illustrating a top view of an exemplary HV semiconductor device according to a second embodiment of the present disclosure.

FIG. 7 is a schematic diagram illustrating a top view of an exemplary HV semiconductor device according to a second embodiment of the present disclosure. The HV semiconductor device 200 provided in this embodiment is different from the first embodiment in that the HV semiconductor device 200 may have high breakdown voltage at one terminal (drain or source). Specifically, the HV semiconductor device 200 doesn't include the second drift region, the fourth isolation structure and the fifth isolation structure in the first embodiment. In this embodiment, the HV semiconductor device 200 may further include a contact doped region 232 in the semiconductor substrate 102 and next to the second doped region 114. The contact doped region 232 may be formed after forming the second doped region 114 and has the second conductivity type. In some embodiments, the HV semiconductor device 200 may not include the well region.

Figure 8:
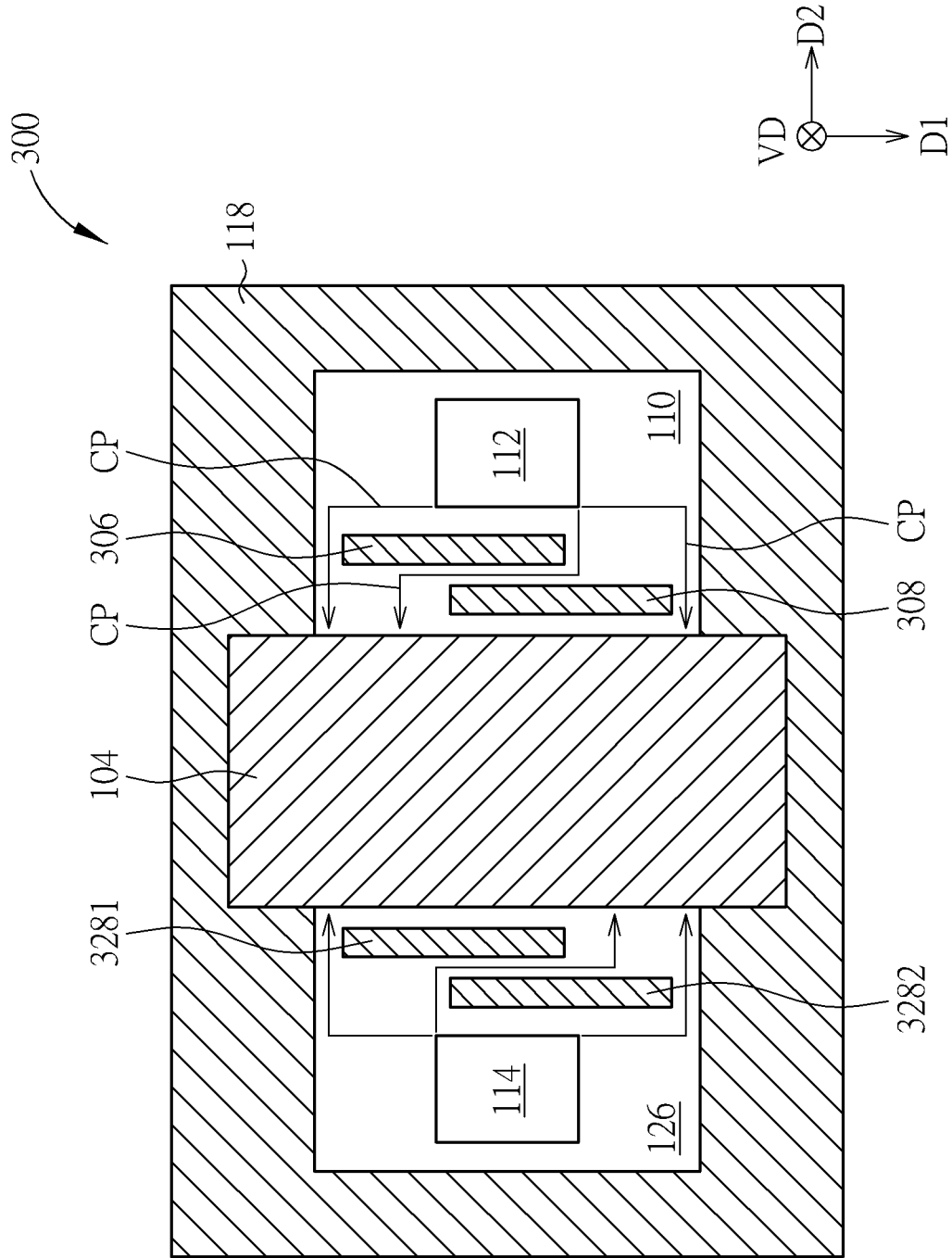
FIG. 8 is a schematic diagram illustrating a top view of an exemplary HV semiconductor device according to a third embodiment of the present disclosure.

FIG. 8 is a schematic diagram illustrating a top view of an exemplary HV semiconductor device according to a third embodiment of the present disclosure. The HV semiconductor device 300 provided in this embodiment is different from the first embodiment in that the first isolation structure 306 is separated from the third isolation structure 118. Accordingly, a plurality of current paths CP may exist between the first doped region 112 and the channel region. In some embodiments, the second isolation structure 308 may be separated from the third isolation structure 118. In some embodiments, the fourth isolation structure 3281 and/or the fifth isolation structure 3282 may also be separated from the third isolation structure 118. In some embodiments, the layout of the fourth isolation structure 3281 and the fifth isolation structure 3282 may be symmetrical to the layout of the first isolation structure 306 and the second isolation structure 308 with respect to the gate structure 104.

Figure 9:
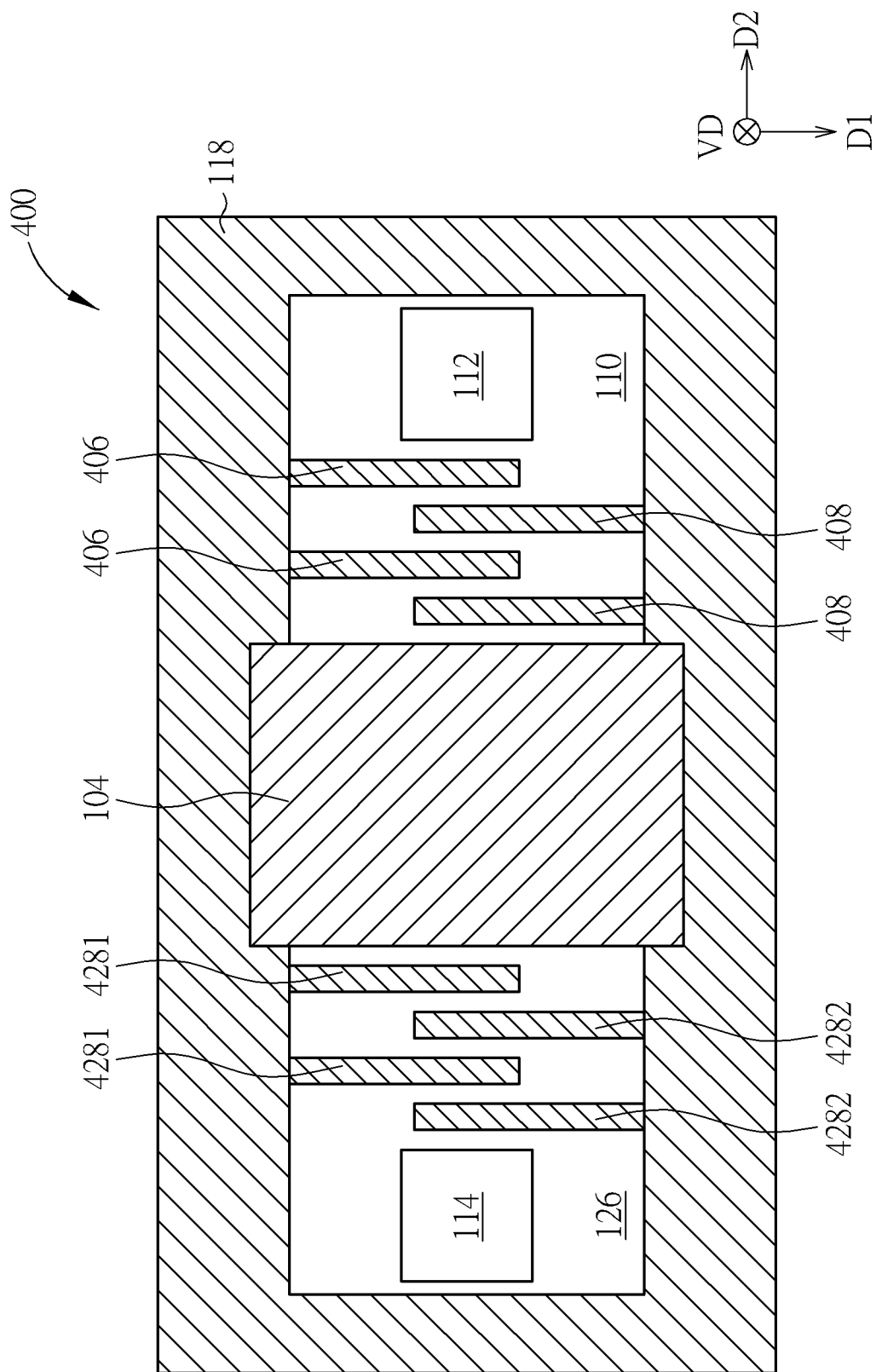
FIG. 9 is a schematic diagram illustrating a top view of an exemplary HV semiconductor device according to a fourth embodiment of the present disclosure.

FIG. 9 is a schematic diagram illustrating a top view of an exemplary HV semiconductor device according to a fourth embodiment of the present disclosure. The HV semiconductor device 400 provided in this embodiment is different from the first embodiment in that the HV semiconductor device 400 includes a plurality of first isolation structures 406 and a plurality of second isolation structures 408, in which each second isolation structure 408 and each first isolation structure 406 are arranged along the second direction D2 alternately. In some embodiment, each first isolation structure 406 and each second isolation structure 408 may be similar to or the same as the first isolation structure and the second isolation structure of any one of the embodiments of the present disclosure respectively and will not be detailed. In some embodiments, the number of the first isolation structure 406 and the number of the second isolation structure 408 may be identical or different. In some embodiments, the HV semiconductor device 400 may optionally include a plurality of fourth isolation structures 4281 and a plurality of fifth isolation structure 4282, in which each fifth isolation structure 4282 and each fourth isolation structure 4281 are arranged along the second direction D2 alternately. Each fourth isolation structure 4281 and each fifth isolation structure 4282 may be similar to or the same as the fourth isolation structure and the fifth isolation structure of any one of the embodiments of the present disclosure respectively and will not be detailed. In some embodiments, the number of the fourth isolation structure 4281 and the number of the fifth isolation structure 4282 may be identical or different. In some embodiments, the layout of the fourth isolation structure 4281 and the fifth isolation structure 4282 may be symmetrical to the layout of the first isolation structure 406 and the second isolation structure 408 with respect to the gate structure 104.

Figure 10:
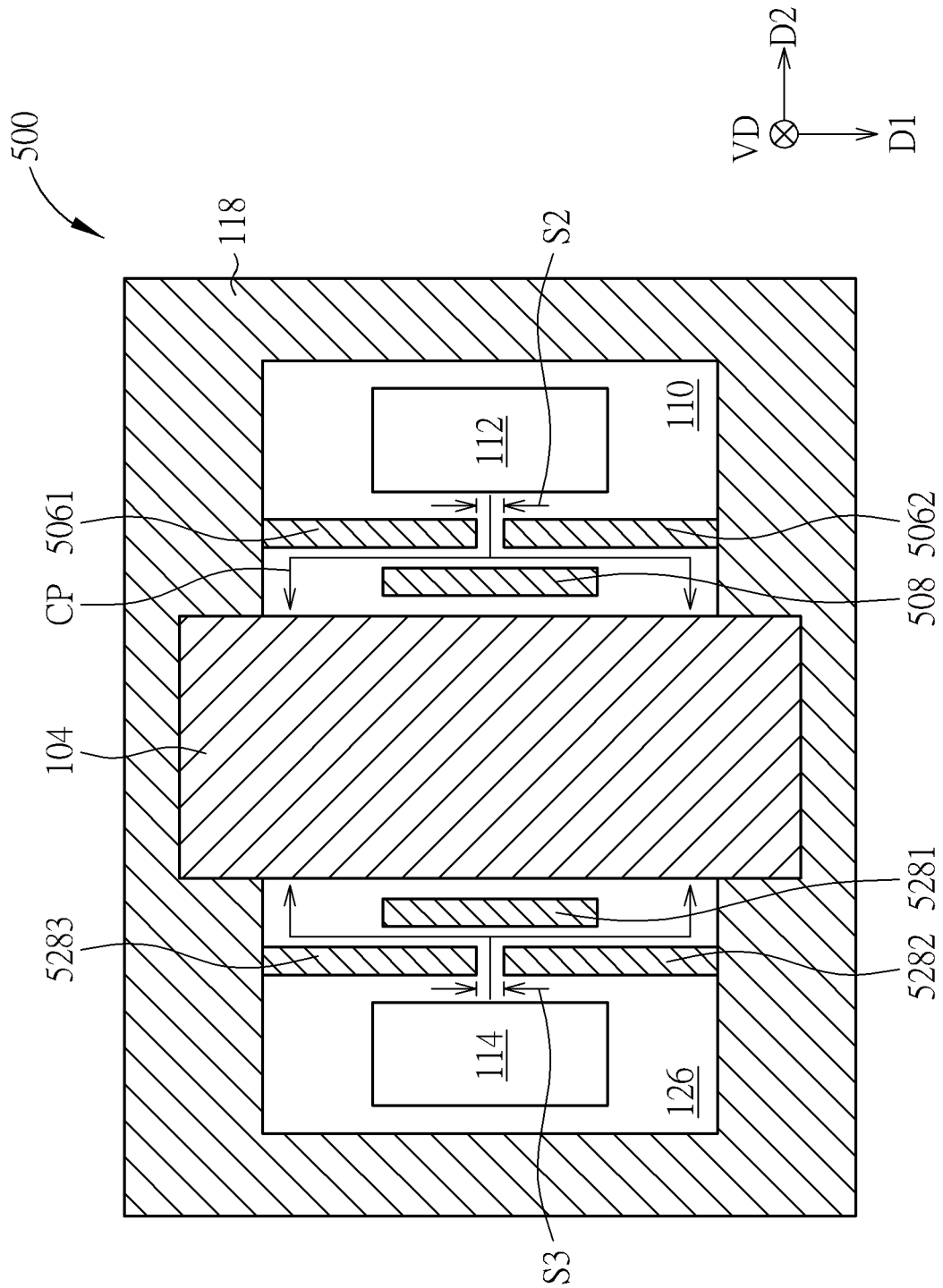
FIG. 10 is a schematic diagram illustrating a top view of an exemplary HV semiconductor device according to a fifth embodiment of the present disclosure.

FIG. 10 is a schematic diagram illustrating a top view of an exemplary HV semiconductor device according to a fifth embodiment of the present disclosure. The HV semiconductor device 500 provided in this embodiment is different from the first embodiment in that the at least one first isolation structure 506 includes two first isolation structure 5061, 5062 vertically penetrating through the first drift region 110, in which the first isolation structures 5061, 5062 are aligned along the first direction D1, and the first isolation structures 5061, 5062 are spaced apart from each other by a space S2, and the space S2 is disposed between the second isolation structure 508 and the first doped region 112. In some embodiments, the second isolation structure 508 may be disposed between the first doped region 112 and the space S2.

In some embodiments, the at least one appending isolation structure 528 may optionally further include another fifth isolation structure 5283 vertically penetrating through the second drift region 126, in which the fifth isolation structures 5282, 5283 are aligned along the first direction D1, and the fifth isolation structures 5282, 5283 are spaced apart from each other by a space, and the space S3 is disposed between the fourth isolation structure 5281 and the second doped region 114. In some embodiments, the layout of the fourth isolation structure 5281 and the fifth isolation structures 5282, 5283 may be the same as the layout of the first isolation structures 5061, 5062 and the second isolation structure 508.

Figure 11:
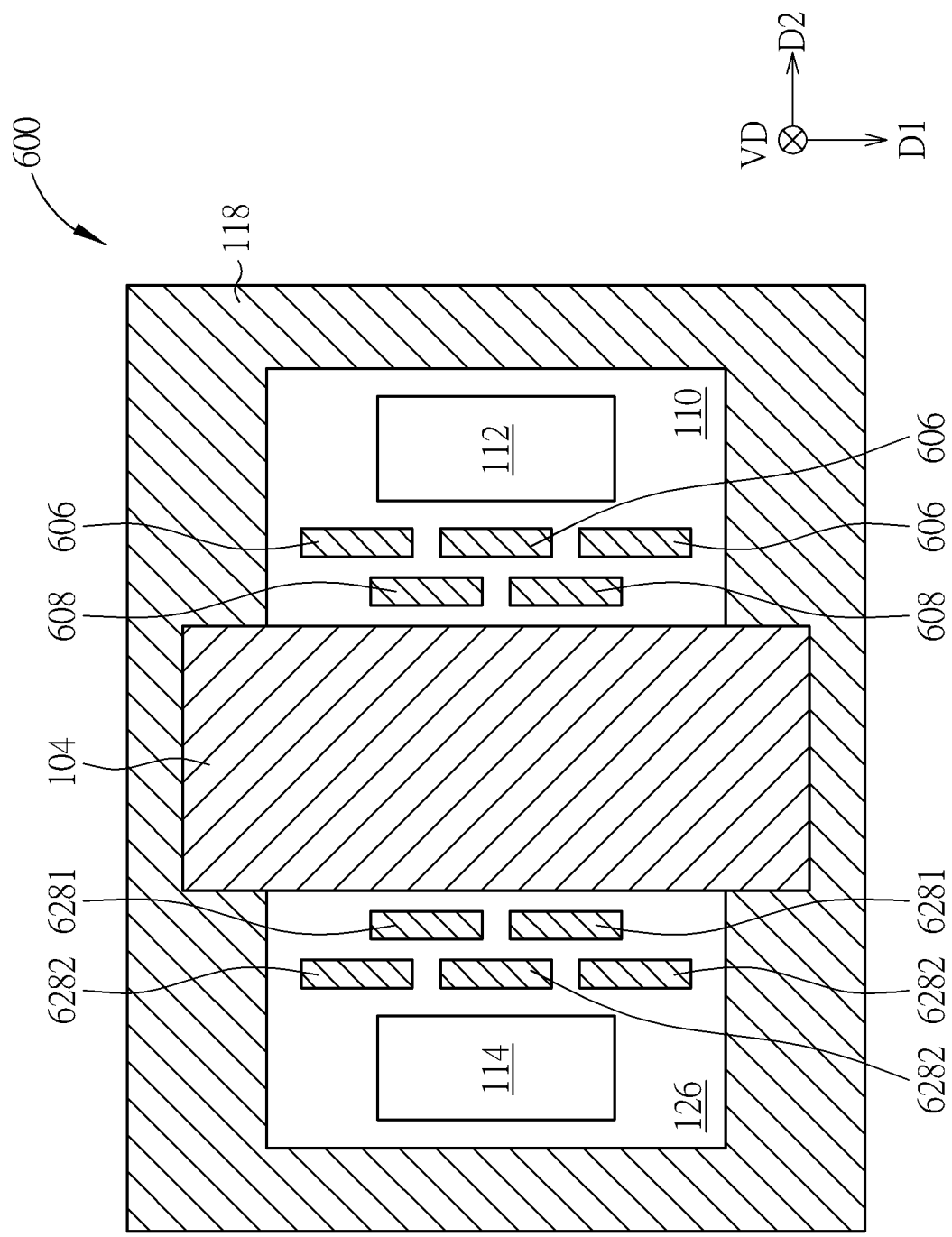
FIG. 11 is a schematic diagram illustrating a top view of an exemplary HV semiconductor device according to a sixth embodiment of the present disclosure.

FIG. 11 is a schematic diagram illustrating a top view of an exemplary HV semiconductor device according to a sixth embodiment of the present disclosure. As shown in FIG. 11, the HV semiconductor device 600 of this embodiment is different from the first embodiment in that the number of the first isolation structures 606 may be plural and the number of the second isolation structures 608 may be plural. In some embodiments, the first isolation structures 606 may be aligned along the first direction D1, the second isolation structures 608 may be aligned along the first direction D1, and the first isolation structures 606 are misaligned with the second isolation structures 608 in the second direction D2. In some embodiments, at least two of the first isolation structures 606 may not be aligned along the first direction D1. Alternatively, at least two of the second isolation structures 608 may not be aligned along the first direction D1. The numbers of the fourth isolation structures 6281 and the fifth isolation structures 6282 may be plural, and arrangement of the fourth isolation structures 6281 and the fifth isolation structures 6282 may be the same as or different from that of the first isolation structures 606 and the second isolation structures 608 and will not be detailed repeatedly. In some embodiments, the isolation structures between the first doped region 112 and the gate structure 104 are not limited to be arranged in two columns and may be arranged in three or more columns. The isolation structures between the second doped region 114 and the gate structure 104 may be arranged in three or more columns.

By using the disclosed HV semiconductor device and manufacturing method thereof, the depth of the isolation structure between the doped region and the gate structure can be greater than the depth of the drift region, and the length of the combination of the isolation structures spaced apart from each other is greater than or equal to the length of the first doped region, so the breakdown voltage at drain/source can be significantly increased without increasing the channel length of the channel region or the channel length of the channel region can be reduced.

The foregoing description of the specific embodiments will so fully reveal the general nature of the present disclosure that others can, by applying knowledge within the skill of the art, readily modify and/or adapt, for various applications, such specific embodiments, without undue experimentation, and without departing from the general concept of the present disclosure. Therefore, such adaptations and modifications are intended to be within the meaning and range of equivalents of the disclosed embodiments, based on the disclosure and guidance presented herein. It is to be understood that the phraseology or terminology herein is for the purpose of description and not of limitation, such that the terminology or phraseology of the present specification is to be interpreted by the skilled artisan in light of the disclosure and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections can set forth one or more but not all exemplary embodiments of the present disclosure as contemplated by the inventor(s), and thus, are not intended to limit the present disclosure and the appended claims in any way.

What is claimed is:

1. A method for manufacturing a high voltage semiconductor device, comprising:
    providing a semiconductor substrate having a first conductivity type, wherein the semiconductor substrate has an active area;
    forming at least one first isolation structure and at least one second isolation structure in the active area of the semiconductor substrate;
    forming a gate structure on the active area of the semiconductor substrate and at a side of the at least one first isolation structure in a top view of the high voltage semiconductor device, wherein the gate structure extends along a first direction, and in the top view, an end of the at least one second isolation structure is disposed between the at least one first isolation structure and the gate structure in a second direction perpendicular to the first direction; and
    forming at least one first drift region in the active area of the semiconductor substrate at a side of the gate structure in the top view, and the at least one first drift region having a second conductivity type complementary to the first conductivity type, wherein a bottom of the at least one first isolation structure and a bottom of the at least one second isolation structure are deeper than a bottom of the at least one first drift region, and in the top view, the at least one first drift region has a Z-shaped part extending from an end of the at least one first isolation structure to the end of the at least one second isolation structure through a space between the at least one first isolation structure and the at least one second isolation structure, such that the at least one first drift region has a zigzag-shaped current path.

2. The method for manufacturing the high voltage semiconductor device according to claim 1, further comprising forming at least one first doped region in the at least one first drift region, wherein the at least one first doped region has the second conductivity type.

3. The method for manufacturing the high voltage semiconductor device according to claim 2, wherein a doping concentration of the at least one first drift region is less than a doping concentration of the at least one first doped region, and in the top view, the end of the at least one first isolation structure is disposed between the at least one first doped region and the at least one second isolation structure in the second direction.

4. The method for manufacturing the high voltage semiconductor device according to claim 2, wherein a length of a combination of the at least one first isolation structure and the at least one second isolation structure in the first direction is greater than or equal to a length of the at least one first doped region in the first direction.

5. The method for manufacturing the high voltage semiconductor device according to claim 1, wherein forming the at least one first isolation structure and the at least one second isolation structure comprises forming a third isolation structure in the semiconductor substrate, wherein the third isolation structure has an opening defining the active area.

6. The method for manufacturing the high voltage semiconductor device according to claim 5, wherein at least one of the at least one first isolation structure or the at least one second isolation structure is connected to the third isolation structure.

7. The method for manufacturing the high voltage semiconductor device according to claim 2, wherein forming the at least one first doped region comprises forming at least one second doped region in the active area of the semiconductor substrate at another side of the gate structure in the top view, and the at least one second doped region having the second conductivity type.

8. The method for manufacturing the high voltage semiconductor device according to claim 7, wherein forming the at least one first drift region further comprises forming at least one second drift region in the active area of the semiconductor substrate at the another side of the gate structure in the top view, and the at least one second doped region is disposed in the at least one second drift region, wherein the at least one second drift region has the second conductivity type, and a doping concentration of the at least one second drift region is less than a doping concentration of the at least one second doped region.

9. The method for manufacturing the high voltage semiconductor device according to claim 8, wherein forming the at least one first isolation structure and the at least one second isolation structure further comprises forming at least one appending isolation structure in the active area of the semiconductor substrate between the at least one second doped region and the gate structure in the top view.

10. The method for manufacturing the high voltage semiconductor device according to claim 9, wherein the at least one appending isolation structure comprises at least one fourth isolation structure and at least one fifth isolation structure, and a layout of the at least one fourth isolation structure and the at least one fifth isolation structure is equal to a layout of the at least one first isolation structure and the at least one second isolation structure or symmetrical to the layout of the at least one first isolation structure and the at least one second isolation structure with respect to the gate structure.

11. The method for manufacturing the high voltage semiconductor device according to claim 1, wherein the at least one first drift region is disposed on the end and two opposite sides of the at least one first isolation structure and on the end and two opposite sides of the at least one second isolation structure in the top view, and in the top view, the end of the at least one second isolation structure is disposed between one of the two opposite sides of the at least one first isolation structure and the gate structure in the second direction.

12. The method for manufacturing the high voltage semiconductor device according to claim 1, wherein the at least one first drift region is formed after the gate structure is formed.

* * * * *